(12) United States Patent
Ivanov et al.

(10) Patent No.: US 12,068,730 B2
(45) Date of Patent: Aug. 20, 2024

(54) TRIMMING OPERATIONAL AMPLIFIERS

(71) Applicant: Texas Instruments Incorporated, Dallas, TX (US)

(72) Inventors: Vadim Valerievich Ivanov, Tucson, AZ (US); Munaf Hussain Shaik, Tucson, AZ (US); Srinivas Kumar Pulijala, Tucson, AZ (US); Patrick Forster, Freising (DE); Jerry Lee Doorenbos, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 419 days.

(21) Appl. No.: 17/307,327

(22) Filed: May 4, 2021

(65) Prior Publication Data
US 2022/0360239 A1 Nov. 10, 2022

(51) Int. Cl.
*H03F 3/45* (2006.01)
*H03M 1/38* (2006.01)
*H03M 1/66* (2006.01)
*H03F 3/21* (2006.01)

(52) U.S. Cl.
CPC .......... *H03F 3/45475* (2013.01); *H03M 1/38* (2013.01); *H03M 1/66* (2013.01); *H03F 3/211* (2013.01); *H03F 2200/129* (2013.01)

(58) Field of Classification Search
CPC .......... H03F 3/45475; H03F 2200/129; H03F 3/45995; H03F 2203/45048; H03F 3/68; H03F 3/211; H03F 3/602; H03F 3/195; H03F 1/0288; H03F 3/45085; H03F 1/3211; H03F 3/45071; H03F 3/45183; H03F 3/45179; H03F 3/45192; H03F 3/45089; H03M 1/38; H03M 1/66; H03M 1/46
USPC .............................. 330/124 R, 252, 295, 307
See application file for complete search history.

(56) References Cited

U.S. PATENT DOCUMENTS

| | | | |
|---|---|---|---|
| 7,265,611 B2 * | 9/2007 | Wang | H03F 3/45753 327/124 |
| 9,780,745 B2 * | 10/2017 | Boehm | H03F 3/45475 |
| 10,033,331 B1 | 7/2018 | Ivanov et al. | |
| 10,476,456 B2 * | 11/2019 | Shabra | H03K 3/356191 |
| 10,784,883 B1 * | 9/2020 | Tripathi | H03M 1/442 |
| 2019/0190531 A1 * | 6/2019 | Martens | H03M 1/46 |
| 2020/0403630 A1 * | 12/2020 | Ivanov | H03M 1/38 |

* cited by examiner

*Primary Examiner* — Khanh V Nguyen
(74) *Attorney, Agent, or Firm* — Valerie M. Davis; Frank D. Cimino

(57) ABSTRACT

Disclosed is a system comprising a plurality of operational amplifiers, each operational amplifier having individually adjustable operational parameters, and a trimming circuit. The trimming circuit includes successive approximation register (SAR) logic that determines associated memory values. The trimming circuit changes the adjustable operational parameters of each operation amplifier based on the associated memory values.

24 Claims, 3 Drawing Sheets

| OPA1 DECIMAL OFFSET EQUIVALENT: 506 | | | | | | | | |
|---|---|---|---|---|---|---|---|---|
| OPA2 DECIMAL OFFSET EQUIVALENT: 113 | | | | | | | | |
| ONE-HOT BIT GROUP OH[] | | OPA54 OUTPUT | OPA55 OUTPUT | MEMORY VALUE MV1[] | | MEMORY VALUE MV2[] | | TOTAL TIME |
| BINARY | DECIMAL | | | BINARY | DECIMAL | BINARY | DECIMAL | |
| 1000000000000 | 8192 | 1 | 1 | 00000000000000 | 0 | 00000000000000 | 0 | 20 |
| 0100000000000 | 4096 | 1 | 1 | 00000000000000 | 0 | 00000000000000 | 0 | 40 |
| 0010000000000 | 2048 | 1 | 1 | 00000000000000 | 0 | 00000000000000 | 0 | 60 |
| 0001000000000 | 1024 | 1 | 1 | 00000000000000 | 0 | 00000000000000 | 0 | 80 |
| 0000100000000 | 512 | 0 | 1 | 00000000000000 | 0 | 00000000000000 | 0 | 100 |
| 0000010000000 | 256 | 0 | 1 | 00000100000000 | 256 | 00000000000000 | 0 | 120 |
| 0000001000000 | 128 | 0 | 0 | 00000110000000 | 384 | 00000000000000 | 0 | 140 |
| 0000000100000 | 64 | 0 | 0 | 00000111000000 | 448 | 00000001000000 | 64 | 160 |
| 0000000010000 | 32 | 0 | 0 | 00000111100000 | 480 | 00000001100000 | 96 | 180 |
| 0000000001000 | 16 | 0 | 1 | 00000111110000 | 496 | 00000001110000 | 112 | 200 |
| 0000000000100 | 8 | 1 | 1 | 00000111111000 | 504 | 00000001110000 | 112 | 220 |
| 0000000000010 | 4 | 0 | 1 | 00000111111000 | 504 | 00000001110000 | 112 | 240 |
| 0000000000001 | 2 | 1 | 1 | 00000111111010 | 506 | 00000001110000 | 112 | 260 |
| 0000000000000 | 1 | 0 | 0 | 00000111111010 | 506 | 00000001110001 | 113 | 280 |

FIG. 3

TRIMMING OPERATIONAL AMPLIFIERS

TECHNICAL FIELD

The present disclosure relates to the trimming of amplifier devices. More particularly, the present disclosure relates to a system having a plurality of operational amplifiers (op-amps) and a trimming circuit for trimming the operational amplifiers.

BACKGROUND

Operational amplifiers can be trimmed during or after manufacture to improve the precision and accuracy of the devices. Some of the main objectives for trimming techniques include the correction of offset, gain and temperature drift, among other parameters, in the devices. Modern trimming techniques for the initial production adjustment of offset, gain and other device parameters generally comprise some type of on-chip digital memory, for example in the form of EPROM or fuse links. During the trimming process, test circuitry can be used to measure the device parameters to make a determination as to how many and which bits of a memory value should be set, e.g. from a "zero" or "low" state to the opposite "one" or "high" state.

SUMMARY

A system comprising operational amplifiers and a trimming circuit is disclosed. The system comprises a plurality of operational amplifiers. Each operational amplifier has individually adjustable operational parameters. The trimming circuit can adjust the operational parameters based on associated memory values to compensate for offset voltages of the operational amplifiers. The trimming circuit comprises a successive approximation register (SAR) logic that controls the associated memory values. The SAR logic can be configured to determine, for each operational amplifier, the associated memory value that causes an output voltage of the respective channel to be within a predetermined voltage interval when applying a defined common mode voltage to inverting and non-inverting inputs of the operational amplifier. The SAR logic can be configured to simultaneously iterate through bit positions of the associated memory values, for each channel, determining bits of the associated memory values at the bit positions.

Another example relates to an integrated circuit comprising a system having a plurality of operational amplifiers and a trimming circuit. Each channel has individually adjustable operational parameters. The trimming circuit can adjust the operational parameters based on associated memory values to compensate for offset voltages of the operational amplifiers. The trimming circuit can comprise a successive approximation register (SAR) logic that controls the associated memory values. The SAR logic can be configured to simultaneously iterate through bit positions of the associated memory values for each operational amplifier, determining bits of the associated memory values at the bit positions.

BRIEF DESCRIPTION OF THE DRAWINGS

FIG. 3 illustrates a table showing exemplary binary states and values during each iteration of the SAR logic while determining the associated memory values according to an embodiment of the invention.

DETAILED DESCRIPTION

An integrated circuit (IC) is disclosed. The IC can comprise a plurality of channels (op-amps). A channel contains one of multiple op-amps contained on an IC or within a package (e.g. Dual or Quad op-amps).

The IC can employ one or more integrated op-amps to measure offset of the op-amps during trimming procedure after fabrication of the IC. The IC can also include a trimming circuit.

During the trimming procedure, the inputs (inverting inputs and non-inverting inputs) of the respective op-amps can be connected to a common voltage source at a predetermined voltage level where an offset is expected. The two inputs can also be connected to a pre-determined voltage (does not always have to be a common-mode).

Upon detecting that the trimming procedure has started, an oscillator can generate a clock signal. The oscillator can provide the clock signal to a Successive Approximation Register logic (SAR logic) driven by the respective op-amp output. During the trimming procedure, the op-amp can operate as a comparator of its own offset voltages. Moreover, based on the op-amp outputs, the SAR logic can write associated values to memory that control a respective offset voltage of the op-amps. In particular, the values are employed to control switches that adjust internal operational parameters of the op-amp (e.g. internal current and/or internal resistance) during normal operation of the op-amp.

Figure 1:
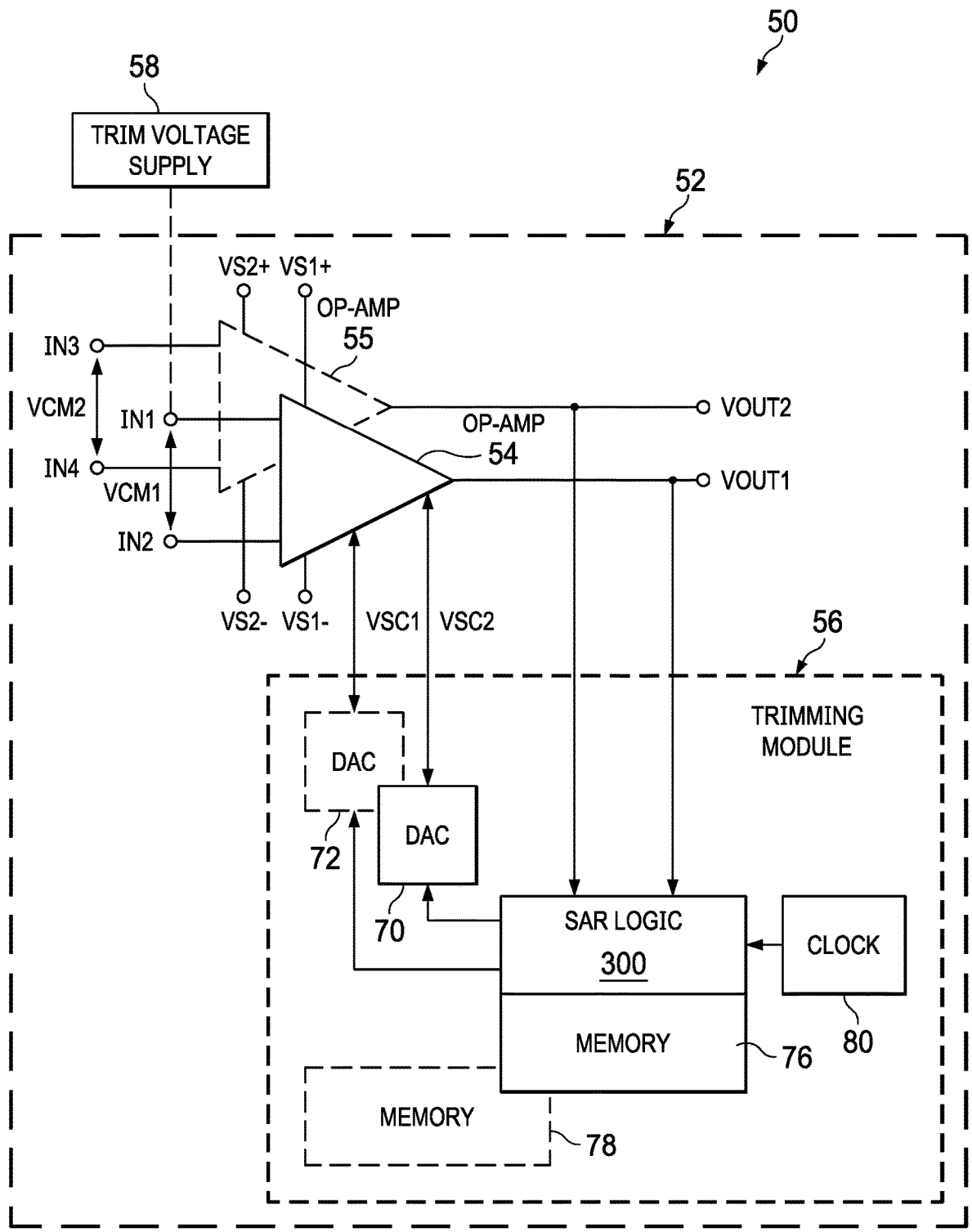
FIG. 1 illustrates a block diagram of a system for trimming operational amplifiers integrated circuit according to an embodiment of the invention.

FIG. 1 illustrates a block diagram of a system 50 for trimming an integrated circuit (IC) 52 that includes operational amplifiers 54 and 55 such that the IC 52 can be referred to as a multi-channel op-amp IC. Fabrication tolerances of the op-amp IC 52 allow for situations where the internal components (e.g. transistors and resistors) cause operational parameters of op-amps 54 and 55 to operate at levels outside acceptable limits. Accordingly, the op-amp IC 52 can include an internal trimming circuit 56 that can measure parameters under test, e.g. output voltages VOUT1 and VOUT2 of the respective op-amps 54 and 55, and generate control voltages (trim control signals) VSC1 and VSC2 that cause the op-amps 54 and 55 to compensate for the undesired offset voltages of the respective op-amps 54 and 55. Comparable systems for trimming an op-amp (channel) are described in more detail in U.S. Pat. No. 10,033,331, which is hereby incorporated by reference in its entirety.

For purposes of simplification of explanation, the trimming circuit 56 is illustrated and described as being internal to the IC 52. However, in some examples, the trimming circuit 56 can be external to the IC 52.

Upon fabrication of the op-amp IC 52, the op-amps 54 and 55 can be electrically coupled to a trim voltage supply 58. The trim voltage supply 58 can be, for example, test circuitry (e.g. automatic test equipment) configured to actuate a trimming procedure at the trimming circuit 56 connected to the op-amps 54 and 55. Additionally, inverting input leads IN1 and IN3, and a non-inverting input leads IN2 and IN3 can be shorted together by the trim voltage supply 58. Moreover, the trim voltage supply 58 can apply a common mode voltage VCM1 and VCM2 to both inverting input leads and a non-inverting input leads of the op-amps 54 and 55 respectively.

Op-amps 54 and 55 can be configured to operate at a nominal voltage. For example, a given common mode voltage VCM1 (e.g. a voltage at about 0.5 V less than the nominal voltage), can be set at the inverting INV1 and the non-inverting INV2 inputs of the op-amp 54 to actuate the trimming procedure. In such a situation, the trimming circuit 56 can detect the given common mode voltage VCM1, applied at both the inverting and non-inverting inputs of the op-amp 54 and initiate the trimming procedure in response to the detection. In some examples, multiple trimming procedures can be executed. For instance, in some such examples, the positive supply voltage VS2+ can be used to set a trimming procedure for op-amp 55, and the common mode voltage, VCM1, can be used to set another trimming procedure for op-amp 54.

Upon application of the common mode voltages VCM1 and VCM2 by the trim voltage supply 58 and/or the positive supply voltages VS1+ and VS2+, the trimming circuit 56 can trigger a trimming procedure(s). In some examples, the trimming circuit 56 can measure the positive supply voltage VS2+ of the op-amp 55. Accordingly, upon detecting the positive supply voltage VS2+ being set to voltage at or near the common mode voltage VCM2, the trimming circuit can actuate the trimming procedure for op-amp 55. In other examples, a code sequence can be applied to inputs IN1, IN2, IN3, and IN4 of the op-amp IC to indicate that the trimming procedure has started.

In the trimming procedure, the trimming circuit 56 can provide a trim signal VSC1 (e.g. a controlled voltage and/or current signal) of the trimming circuit 56 that adjusts (e.g. trims) operational parameters of the op-amp 54 which in turn adjusts the parameter under test, e.g. the output voltage VOUT1 of the op-amp 54. The trimming circuit 56 may comprise, for example, digital-to-analog converters (DACs) 70 and 72 for each op-amp 54 and 55 respectively that provides the respective trim signals VSC1 and VSC2 adjusting current provided by internal transistors of the op-amps 54 and 55. In additional examples, the trimming circuit 56 may use DACs 70 and 72 that provide the trim signals VSC1 and VSC2 respectively to adjust a resistance of internal resistors of the op-amps 54 and 55 respectively. In further examples, the trimming circuit 56 may be configured to provide the trim signals VSC1 and VSC2 to adjust the size of a bank of internal transistor devices in the op-amps 54 and 55. That is, multiple transistor devices can be coupled in parallel in a bank of internal transistor devices, and the trim signals VSC1 and VSC2 can be employed to control the number of transistor devices that are activated in the bank of internal transistor devices. Moreover, in some examples, the trimming circuit 56 can be configured as a combination of a current DAC, a resistor DAC and/or a transistor adjustor.

The trimming circuit 56 can measure the parameter under test (e.g. the output voltages VOUT1 and VOUT2) to determine the trim signals VSC1 and VSC2 that results in a parameter under test being within a predetermined interval, e.g. output voltages VOUT1 and VOUT2 that are within a predetermined voltage interval. For example, the predetermined voltage interval can be within +/−1 V, +/−0.5 V, +/−0.1 V, or any suitable other voltage interval. Differently speaking, the trimming circuit 56 can determine the trim signals VSC1 and VSC2 that respectively result in output voltages VOUT1 and VOUT2 that are at or near 0 V (e.g. electrically neutral). The trimming circuit 56 can record data characterizing the trim control signals VSC1 and VSC2 with the output voltage at or near 0 V in a non-volatile memories 76 and 78 respectively. Moreover, the trimming circuit 56 can also disable further trimming procedures, such that the trimming procedure is executed once for the op-amp IC 52.

The op-amp IC 52 can be configured such that upon completion of the trimming procedure, the op-amp IC 52 can be decoupled (e.g. removed) from the trim voltage supply 58 and subsequently employed in another circuit. In such a situation, the trimming circuit 56 can provide the trim signals VSC1 and VSC2 that achieved output voltages VOUT1 and VOUT2 of about 0 V with common mode voltage signals VCM1 and VCM2 at the offset voltage level VOS. In this manner, the op-amps 54 and 55 are considered to be "trimmed" and can operate as a multi-channel precision op-amp.

By employment of the op-amp IC 52, no external measurements of operational parameters, such as input and/or output currents and/or voltages of the op-amps 54 and 55 are needed to trim the op-amps 54 and 55. Thus, the time and expense of measuring such operational parameters with external circuitry can be avoided. Furthermore, as explained herein, the components of the trimming circuit 56 are relatively small. Thus, the inclusion of the trimming circuit 56 as part of the op-amp IC 52 does not significantly increase a die size (or cost) of the op-amp IC 52. The trim voltage supply 58 sets the common mode voltages VCM1 and VCM2, and waits a time sufficient (e.g. 1-40 milliseconds) to determine the trim control signals VSC1 and VSC2. Thus, the trim voltage supply 58 can be implemented with relatively simple hardware and/or software.

In this example, two op-amps 54 and 55 were illustrated. However, in other embodiments one op-amp may be used or more than two op-amps may be used.

Figure 2:
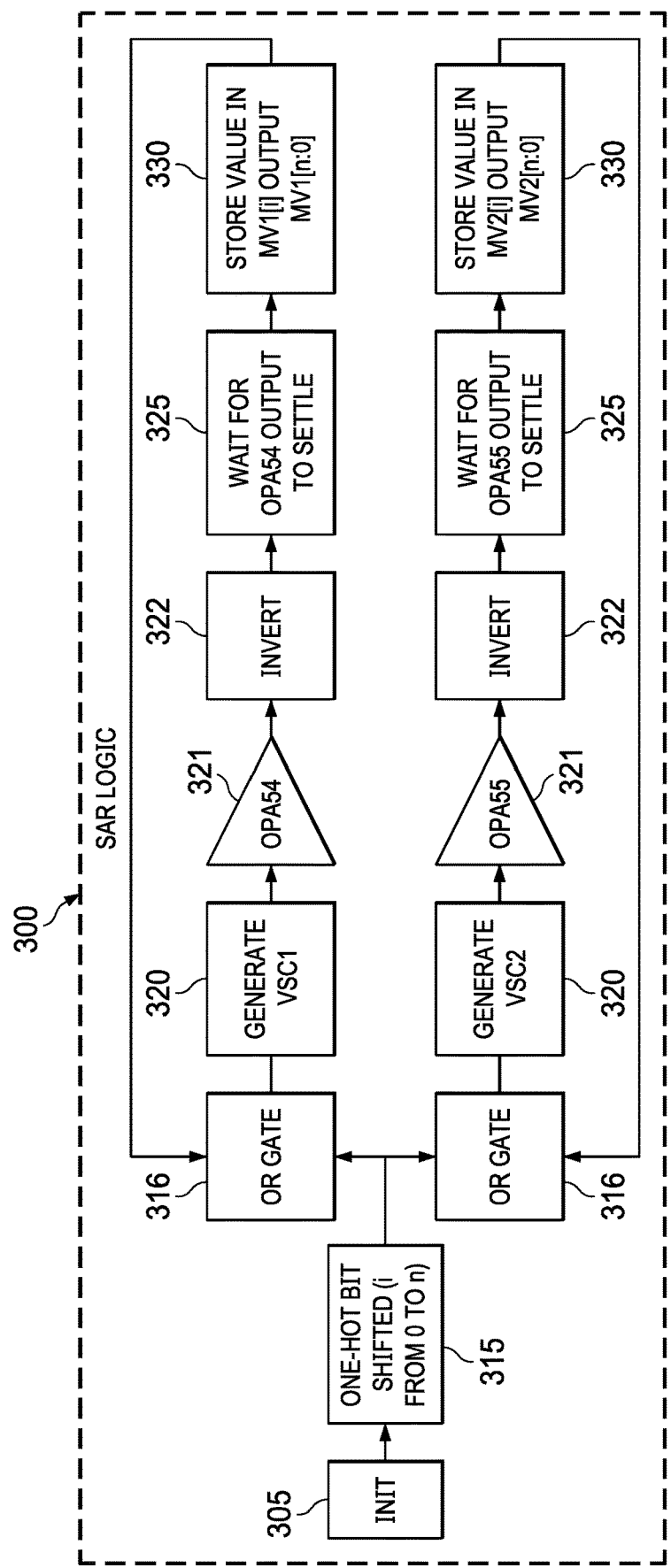
FIG. 2 illustrates SAR logic for trimming operational amplifiers integrated circuit according to an embodiment of the invention.

FIG. 2 illustrates an example of successive approximation register (SAR) logic 300 for trimming an op-amp IC having a plurality of op-amps. The SAR logic 300 may be implemented, by the op-amp IC being trimmed, such as the op-amp IC 52 of FIG. 1. A trimming circuit 56 integrated or coupled with the op-amp IC can trigger operation of the op-amp IC in a trim mode. The triggering can be based, for example on detection of a high voltage (e.g. 7 V) signal at a supply voltage VS1+ of an op-amp (e.g. the op-amp 54 of FIG. 1). Additionally or alternatively, the triggering can based on a detection of a predetermined common mode voltage being applied to an inverting input IN1 and a non-inverting input IN2 of the op-amp 54. In trim mode, inverted and non-inverting inputs of the op-amp 54 can be coupled to a common mode voltage VCM1.

The trimming circuit 56 can adjust a trim control signal VSC1 that adjusts a parameter under test, such as an output voltage VOUT1 of the op-amp 54. The parameter under test—e.g. the output voltage VOUT1—can be measured by the trimming circuit 56. A determination can be made as to whether to accept the trim control signal VSC1. The determination may be based, for example on the measured values. For instance, if the parameter under test (e.g. VOUT) is within a predetermined (voltage) interval (about 0 V), the determination can be positive (e.g. YES) and the SAR logic can proceed. Conversely, if the parameter under test (e.g. VOUT) is not within the predetermined interval (e.g. at a high voltage), the SAR logic can start a new iteration.

In some examples, the SAR logic may iterate (cycle) memory values, and/or trim adjustment voltage VSC1 through a series of values, levels or voltages until the offset voltages (detected at the output VOUT1 of the operational amplifier 54) falls below a threshold voltage (e.g. determined by a threshold voltage in a Schmidt trigger). When the offset value falls below the threshold voltage, the trim adjustment values, levels, or voltages are stored in the associated memory 76 of the op-amp IC 52 for further use during normal operation (e.g. when not operating in trim mode) of the op-amp.

With regard to FIG. 2 and FIG. 3, trimming a dual-channel op-amp is described. It is to be understood, however, that more than two channels can be trimmed simultaneously without departing from the disclosed concept. The SAR logic 300 is configured to simultaneously iterate through bit positions of the associated memory values for each channel, determining bits of equal bit-weight of the associated memory values at the bit positions concurrently.

At 305, the memory values MV1, MV2 can be cleared, if necessary. In other words, all register bits representing the memory values can be set to '0'/low. The memory values MV1, MV2 are binary values having n bits. In the following, a MSB-0 numbering scheme is used, i.e. the bit of the memory values MV1, MV2 having the highest bit weight (most significant bit) is the leftmost bit having the index '0'.

At the beginning, index i can be set to zero, such that the first iteration of the SAR logic can determine the most significant bits MV1[0], MV2[0] of the memory values MV1, MV2, respectively.

At 315, the indexed bit one-hot (OH[i]) of the one-hot bit-group OH[i] can be set to '1'/high. All other bits of the one-hot bit-group OH can set to '0'/low. The one-hot bit-group OH can be provided, for example, by a one-hot counter, e.g. a straight ring counter. In the beginning, the most significant bit OH[0] is set to high.

At 316, a binary OR-operation is performed on the one-hot bit-group OH and the respective memory values MV1, MV2. In a particular example, only bits 0 to n of the memory values MV1, MV2, which have previously been determined, are fed back into the binary OR-operation.

At 320, the trim control signals VSC1 and VSC2 can be adjusted. This can be done by controlling a plurality of digital-to-analog converters 70 and 72 (or a dual-channel DAC), such that the DACs translates the respective results of the bitwise OR-operation to trim control signals VSC1 and VSC2 for trimming of the operational amplifier 54 and operational amplifier 55 respectively.

At 321, the adjusted trim control signals VSC1 and VSC2 are fed into the op-amps 54 and 55 respectively to control their operational parameters. Outputs VOUT1 and VOUT2 of the respective op-amps 54 and 55 can be measured, after letting the op-amps 54 and 55 responses settle at 325.

At 322, the outputs of the op-amp can be inverted. In other words, an output of approximately 0 V can be interpreted as TRUE/high when measured, an output of approximately the nominal voltage, e.g. 7 V can be interpreted as FALSE/low when measured.

At 325, the SAR logic can wait/sleep for a predetermined timespan, to let the respective outputs of the DACs 70 and 72 and the operational amplifiers 54 and 55 settle. The predetermined timespan can be constant. For example, the predetermined timespan can approximately be between 1 to 40 ms (Milliseconds). In a digital implementation of the SAR logic 300, this step can comprise a sleep routine. An alternative implementation can comprise an appropriately chosen clock cycle speed or an appropriate multiplier of the frequency of an internal or external clock 80.

In an alternative example, the predetermined timespan can depend on the bit-weight of the bit to be determined.

At 330, the measured (and inverted) values can be stored at the respective bit-positions of the memory values, MV1[i], MV2[i]. All determined bits of the associated memory values MV1[n:0], MV2[n:0] (or alternatively the whole memory values) can be outputted into the OR-gate (bitwise OR-operation) to start a new iteration cycle.

FIG. 3 shows a table comprising states of the one-hot binary-group OH, the respective memory values MV1, MV2 in binary format, as well as the (not yet inverted) states of the op-amps 54 and 55, and the total time of the trimming process.

It is assumed that in this particular example, the first op-amp 54 has an offset voltage corresponding to a decimal value equivalent of 506. The second op-amp 55 is assumed to have an offset voltage corresponding to a decimal value equivalent of 113.

The first column shows the one-hot bit-group OH[ ] in a binary representation. The single hot-bit gets shifted one bit position per iteration cycle from most significant bit to least significant bit.

The second column shows the one-hot bit-group OH[ ] in a decimal representation. In other words, the second column shows the bit-weight of the respective hot-bit of the same line in the first column.

The third and fourth column comprise the respective output voltage of the op-amp channels. A '1' represents a high output voltage VOUT at around the nominal voltage. A '0' represents a low output voltage of approximately 0 V.

The fifth and sixth columns show the memory values MV1[ ] in iteration cycle i, associated with the first op-amp 54 in a binary and a decimal representation. The seventh and eighth columns show the memory values MV2[ ] in iteration cycle i, associated with the second op-amp 55 in a binary and a decimal representation.

For example, the first bits MV1[i], MV2[i] for i=0 of the memory values MV1[ ], MV2[ ] can respectively be determined by inverting the output of the op-amp 54 when a trim value signal VSC1 representing the one-hot bit-group OV[ ] having a high most significant bit (column 1) is fed into the op-amp 54. The following bits MV[i=i+1] of the respective memory values MV1[ ], MV2[ ] can be determined in a similar manner, one iteration cycle at a time. Each further iteration cycle i=i+1 comprises adding the inverted output of the respective op-amp 54 at the current bit position MVx[i] when feeding a trim control signal VSC1 into the op-amp 54, the trim control signal VSC corresponding to the result of the logical inclusive OR-operation on the previously determined memory value MVx[ ] for i−1 and the current one-hot bit-group at the current bit position OH[i].

Consecutive time stamps for each iteration cycle are shown in the last column. A determined constant timespan/wait-time of 20 ms per iteration cycle is assumed.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications and variations that fall within the scope of this application, including the appended claims. As used herein, the term "includes" and "comprises" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

The invention claimed is:

1. A system comprising:
    a plurality of operational amplifiers, each operational amplifier of the plurality of operational amplifiers having individually adjustable operational parameters, and
    a trimming circuit coupled to the plurality of operational amplifiers;
    wherein the trimming circuit comprises successive approximation register (SAR) logic;
    wherein the SAR logic is configured to determine for each operational amplifier an associated memory value;
    wherein the trimming circuit is configured to change the adjustable operational parameters of each operational amplifier based on the associated memory values.

2. The system of claim 1, wherein the SAR logic is configured to iterate through bit positions of the associated memory values for each operational amplifier, determining bits of the associated memory values at the bit positions.

3. The system of claim 1, wherein the associated memory values cause an output voltage of each operational amplifier to be within a voltage range when a defined common mode voltage is applied to inverting and non-inverting inputs of each operational amplifier.

4. The system of claim 1, wherein the trimming circuit adjusts the operational parameters based on associated memory values to compensate for offset voltages on the operational amplifiers.

5. The system of claim 1, wherein the SAR logic is configured to wait a predetermined timespan during each iteration for allowing operational amplifier responses to settle after changing the operational parameters and before testing the output voltages.

6. The system of claim 1, wherein the trimming circuit comprises a one-hot counter providing the SAR logic with a one-hot bit group, the one-hot bit group having a same bit-length as the associated memory values.

7. The system of claim 6, wherein the one-hot counter is configured to shift a single hot bit one bit-position per iteration from most significant bit of the one-hot bit group to least significant bit.

8. The system of claim 7, wherein the SAR logic is configured to perform a bitwise OR-operation on the associated memory values with the one-hot bit group before testing the respective resulting output voltages.

9. The system of claim 1, wherein the operational amplifier and the trimming circuit are mutually comprised by an integrated circuit.

10. An integrated circuit comprising:
    a successive approximation register (SAR) logic having a first input, a second input, first output and a second output wherein the first input of the SAR logic is configured to be coupled to an output of a first operational amplifier and a second input of the SAR logic is configured to be coupled to the output of a second operational amplifier;
        a first digital-to-analog converter (DAC) having an input and an output wherein the input of the first DAC is coupled to the first output of the SAR logic and the output of the first DAC is configured to generate a first trim signal; and
        a second digital-to-analog converter (DAC) having an input and an output wherein the input of the second DAC is coupled to the second output of the SAR logic and the output of the second DAC is configured to generate a second trim signal.

11. The integrated circuit of claim 10, further comprising a clock circuit coupled to the SAR logic.

12. The integrated circuit of claim 10, further comprising a memory coupled to the SAR logic.

13. The integrated circuit of claim 12, wherein the SAR logic is configured to determine a first memory value based on an output signal from the first operational amplifier and a second memory value based on an output signal from the second operational amplifier.

14. The integrated circuit of claim 13, wherein the first and second memory values are stored in the memory.

15. The integrated circuit of claim 14, wherein the SAR logic is configured to change the first trim signal and the second trim signal based on the first and second memory values respectively.

16. The integrated circuit of claim 15, wherein the first trim signal causes the output signal of the first operational amplifier to be within a voltage range when a defined common mode voltage is applied to inverting and non-inverting inputs of the first operational amplifier.

17. The integrated circuit of claim 15, wherein the second trim signal causes the output signal of the second operational amplifier to be within a voltage range when a defined common mode voltage is applied to inverting and non-inverting inputs of the second operational amplifier.

18. The integrated circuit of claim 11, wherein the SAR logic is configured to wait a predetermined timespan during each iteration for allowing the output signals from the first and second operational amplifiers to settle for a timespan after applying the first and second trim signals.

19. The integrated circuit of claim 18, wherein the timespan is constant.

20. The integrated circuit of to claim 18, wherein the timespan is a function of the clock.

21. An apparatus comprising:
    an integrated circuit (IC) including:
        a first operational amplifier having an inverting and non-inverting input, a trim input, and an output; and
        a second operational amplifier having an inverting and non-inverting input, a trim input, and an output; and
    a trimming circuit including:
        a successive approximation register (SAR) logic having a first input, a second input, a first output, and a second output, the first input couplable to the output of the first operational amplifier, the second input couplable to the output of the second operational amplifier;
        a first digital-to-analog converter (DAC) having an input coupled to the first output of the SAR logic, and having a trim output couplable to the trim input of the first operational amplifier; and
        a second DAC having an input coupled to the second output of the SAR logic, and having a trim output couplable to the trim input of the second operational amplifier.

22. The apparatus of claim 21, wherein the trimming circuit is included on the IC with the first and second operational amplifiers.

23. The apparatus of claim 21, wherein the IC has a trim voltage supply terminal couplable to the inverting and non-inverting inputs of the first operational amplifier and couplable to the inverting and non-inverting inputs of the second operational amplifier.

24. The apparatus of claim 21, the trimming circuit further including a memory and a clock circuit coupled to the SAR logic, the memory configured to store a first trim value for the first operational amplifier, and a second trim value for the second operational amplifier.

* * * * *